United States Patent [19]
Bailey et al.

[11] Patent Number: 5,815,243
[45] Date of Patent: Sep. 29, 1998

[54] ELECTRONIC PREPRESS APPARATUS FOR PRODUCING LITHOGRAPHIC PRINTING PLATES

[75] Inventors: Dwayne E. Bailey, Billerica; Kenneth L. Langlais, Andover, both of Mass.

[73] Assignee: Agfa Division, Bayer Corporation, Wilmington, Mass.

[21] Appl. No.: 538,058

[22] Filed: Oct. 2, 1995

Related U.S. Application Data

[60] Continuation of Ser. No. 261,763, Jun. 20, 1994, abandoned, which is a division of Ser. No. 16,055, Feb. 10, 1993, Pat. No. 5,345,870.

[51] Int. Cl.$^6$ .......................... G03B 27/32; G03B 27/52; B41N 1/00; B41N 3/00
[52] U.S. Cl. ................. 355/27; 355/67; 355/77; 101/453; 101/463.1; 101/473
[58] Field of Search ........................ 355/67, 47; 358/298, 358/299, 450, 452, 464; 347/251, 246; 395/101, 103, 104, 107, 108, 109, 117; 101/453, 463.1–473

[56] References Cited

U.S. PATENT DOCUMENTS

| | | | |
|---|---|---|---|
| 3,511,656 | 5/1970 | Regan, Jr. et al. | 430/204 |
| 3,552,316 | 1/1971 | Ormsbee | 101/462 |
| 3,737,225 | 6/1973 | Aughton | 355/48 |
| 3,945,318 | 3/1976 | Landsman | 101/467 |
| 4,038,077 | 7/1977 | Land | 101/464 |
| 4,054,094 | 10/1977 | Caddell et al. | 101/467 |
| 4,298,272 | 11/1981 | Stievenart et al. | 355/65 |
| 4,308,326 | 12/1981 | Wirth | 355/125 |
| 4,413,286 | 11/1983 | Boston | 358/298 |
| 4,636,066 | 1/1987 | Kanada et al. | 355/71 |
| 4,668,078 | 5/1987 | Pearson | 355/32 |
| 4,862,223 | 8/1989 | Yamashita | 355/54 |
| 5,052,120 | 10/1991 | Lubberts | 101/DIG. 36 |
| 5,094,933 | 3/1992 | Uhrig | 101/467 |
| 5,229,872 | 7/1993 | Mumola | 355/20 |
| 5,379,118 | 1/1995 | Steinhardt et al. | 358/298 |
| 5,385,092 | 1/1995 | Lewis et al. | 101/467 |

*Primary Examiner*—R. L. Moses
*Assistant Examiner*—Shival Virmani
*Attorney, Agent, or Firm*—Julie A. Krolikowski; Edward L. Kelley

[57] ABSTRACT

A positive lithographic printing plate exposed by an imagesetter and suitable for mounting on a press cylinder comprising a photo-lithographic DTR material having a DTR processed RIP image to be printed lithographically and a DTR processed ink repelling region for mounting the printing plate on the press cylinder. The RIP image is exposed according to exposure commands which are sent to the imagesetter by the RIP and the DTR processed ink repelling region is exposed according to exposure commands generated by the imagesetter.

9 Claims, 5 Drawing Sheets

5,815,243

ELECTRONIC PREPRESS APPARATUS FOR PRODUCING LITHOGRAPHIC PRINTING PLATES

This is a continuation of application Ser. No. 08/261,763, filed Jun. 20, 1994, now abandoned, which is a divisional of Ser. No. 08/016,055, filed Feb. 10, 1993 now U.S. Pat. No. 5,345,870.

BACKGROUND OF THE INVENTION

The present invention provides a positive lithographic printing plate and describes a method for the laser exposure of photographic, so called, "direct-to-plate" lithographic printing plate materials by a laser imagesetting device. In particular, the invention relates to laser exposure of photo-lithographic "direct-to-plate" substrates which employ the diffusion transfer reversal process, hereinafter called DTR, and more specifically to photo-lithographic DTR elements suitable for exposure by gas and solid state laser wavelengths. Materials suitable for exposure by lasers emitting in the red region of the electromagnetic spectrum, e.g. helium-neon (HeNe) or some semiconductor diode lasers, are disclosed, e.g. in U.S. Pat. No. 5,059,508 and U.S. Pat. No. 4,501,811 and at least one such material is commercially available and marketed by AGFA-GEVAERT N.V. under the trademark SETPRINT HeNe-plate PP410. An example of a photo-lithographic DTR material suitable for laser exposure in the infra-red region of the electromagnetic spectrum, and therefore capable of being exposed by solid state lasers emitting at infra-red wavelengths, was announced by XENOTRON Co. in "Ifra Newspaper Techniques" No 7 p27, as early as October 1985.

The diffusion transfer reversal process, as described e.g. in U.S. Pat. No. 2,352,014, is a photo-chemical process which through the steps of, imagewise exposure to electromagnetic radiation and chemical processing, results in the formation of a silver image in all regions which were exposed to electromagnetic radiation and a DTR-silver image in all regions which were not exposed to electromagnetic radiation.

In photo-lithographic "direct-to-plate" materials, the silver image and DTR-silver image have the particular characteristics that after chemical processing, the silver image forms water receptive ink repellent regions and the DTR-silver image forms water repellent ink receptive regions. Thus the DTR-silver image, which is formed in areas which were not exposed to electromagnetic radiation and which is ink receiving, is the image which is printed when the DTR "direct-to-plate" material is mounted on an offset press, inked and the inked image is transferred to a printing material. The lithographic DTR printing plate is thus a "positive plate" as defined in "Chemistry for the Graphic Arts" by P. J. Hartsuch,—Graphic Arts Technical Foundation—Pittsburgh, Pa. (1979), in that a "direct-to-plate" DTR photo-lithographic recording substrate must be exposed in all areas for which it is desired that the printing plate formed after chemical processing be ink repellent. The term "positive plate" is used herein in accordance with this definition.

According to well known electronic prepress embodiments, images to be printed by offset printing means are assembled and edited electronically on a page layout workstation or "front end", and then transmitted to a raster image processor or, "RIP" for digital color separation, half-tone screening and image rasterization. The "RIP image", that is the rasterized image to be printed by offset printing means, is then transmitted from the RIP to a laser imagesetter for photographic or film recording. Such an electronic prepress system was described as early as 1977 in U.S. Pat. No. 4,004,079 which also teaches that electronic images can be recorded directly onto printing plate materials.

Electronic prepress systems and components which perform these steps are commercially available and marketed e.g. by MILES AGFA DIV. under the trademark COLORSCAPE, which is a complete electronic prepress system, or e.g marketed by EASTMAN KODAK under the trademark PROPHECY, which is a front end, or e.g. marketed by HYPHEN LTD. under the trademark RIPWARE which is a RIP, or for example marketed by LINOTYPE-HELL under the trademark LINOTRONIC L300 or LINOTRONIC L600, which are imagesetters.

Furthermore, it is also well known in the prior art that to create a "positive plate" by electronic prepress means, a positive image is displayed and edited at the front end and transmitted to the RIP, a positive RIP image is then formed by the RIP and transmitted to an imagesetter and a "positive film" is then recorded by the imagesetter on a photographic substrate which is not lithographic. Here the imagesetter provides imagewise exposure to laser radiation in all image regions which are intended to be inked by the press. After chemical processing a silver image is formed in these imagewise exposed regions which are intended to be inked at the press. The silver image of a positive film has the particular characteristic that it is opaque to certain electromagnetic wavelengths. The silver image formed in the non-exposed background regions of a positive film and which is not intended to be inked by the press, has a uniform background density which is transmissive to these same electromagnetic wavelengths.

It is customary for imagesetter manufacturers to specify a recording substrate which is photographic but not lithographic. Such a substrate is commercially available and marketed by AGFA GEVAERT N.V under the trademark, ZHN which is a silver halide recording substrate. These non-lithographic materials are used in imagesetter devices to produce positive films.

In prior art techniques, these positive films are used as a master for a further exposure step whereby a photo-lithographic DTR substrate is exposed while in contact with an imagesetter positive film and after chemical processing this photo-lithographic substrate provides a positive printing plate. The details of image formation and the inking properties of these prior art photo-lithographic DTR materials are similar to those described above for "direct-to-plate" DTR materials. The prior art materials used for plate making by contact exposure include DTR photo-lithographic printing plate materials which are sensitive to exposure by a tungsten light source. Examples of DTR photo-lithographic plate materials used for contact exposure by a tungsten lamp are commercially available and marketed by MITSUBITSHI under the trademark SILVERMASTER and by AGFA GEVAERT N. V., under the trademark SUPERMASTER.

The additional exposure step of prior art platemaking techniques provides an image reversal in that as a result of placing an exposed and processed imagesetter positive film in contact with an unexposed DTR photo-lithographic plate material and exposing the plate material by a tungsten lamp, tungsten light will only reach the regions of the plate material which are in contact with the transmissive regions of the positive film. The transmissive regions of the positive film are the background regions of the printed image which are not intended to be inked at the press. The prior art, double reversal method which produces a positive printing plate thus requires that the imagesetter expose all ink receiving areas and that the plate material be exposed in all ink repellent areas.

Additional intermediate steps in lithographic platemaking by conventional means, particularly for large presses, involve the mechanical assembly or so called "stripping" of multiple positive films onto a "flat". A flat is assembled for each ink to be used at the press and each flat includes at least one positive film assembled onto a background region. The background region may include such features as registration apertures, crop marks, border regions or color calibration strips used to monitor press conditions during printing runs. In the particular case where a positive printing plate is desired, a background material is used which is transmissive to tungsten lamp radiation. These positive flats, at least one for each ink used at the press, which each include one or more positive films are assembled and contact printed onto photo-lithographic materials as described above. Each positive flat results in a positive lithographic printing plate which is then mounted on the press and printed, allowing the press to print multiple positive films in a single pass.

In stripping operations, the size and shape of the flat is determined by the particular press being used for printing. Features such as the final plate overall dimensions and the dimensions of the plate mechanical gripper areas, used for mounting the plate on the press, must match the particular press cylinder dimensions for proper press mounting. The stripping operation is labor intensive requiring many assembly and masking steps and a high skill level is required since precise alignment of positive films and press mounting features are critical for acceptable printing in color work.

Recent trends in platemaking have provided a means for mounting a DTR photo-lithographic "direct-to-plate" material directly into a laser imagesetter and exposing a plate with the imagesetter. These materials, as described above, are available in web form and can be used to fabricate plates for medium length printing runs with as many as 10,000 printed images being produced from a single plate. Since in this direct-to-plate exposure method, the prior art step of exposing the plate material while in contact with a previously exposed imagesetter positive film is eliminated, so too is the image reversal which occurs during the plate exposure step. Thus direct-to-plate exposure of DTR materials requires that the imagesetter expose only the ink repellent background regions of the RIP image and not the ink receiving image which is intended to be printed at the press. The imagesetter must expose a negative of the RIP image and it must expose all those regions of the final plate for which it is desired that the plate be ink repellent.

Conventional laser imagesetting devices, such as those imagesetters commercially available and marketed by MILES Inc. AGFA Div. under the trademark SELECTSET 5000 and SELECTSET 7000 as well as other imagesetter devices marketed by LINOTYPE-HELL A.G. under the trademark LINOTRONIC L300 and LINOTRONIC L600, are capable of laser exposure of "direct-to-plate" DTR photo-lithographic materials and are capable of exposing a negative of the positive RIP image. It is a particular problem however that imagesetters are not capable of exposing direct-to-plate recording substrates over all regions for which it is desired that the final plate be ink repellent. Since unexposed regions of "direct-to-plate" materials are ink receptive at the final plate, steps must be taken after chemical processing to remove unwanted ink receptive regions of plates exposed by prior art imagesetters. These unwanted ink receptive regions are removed either by chemical or mechanical means, e.g. by cutting the undesired ink receptive regions from the plate before mounting it on the press.

It is a specific problem of conventional laser imagesetters, that in regions where the recording substrate is mechanically clamped during exposure that laser exposure is not possible in the regions shielded by the mechanical clamp mechanism. The inability to expose direct-to-plate materials in clamp regions is well known for both imagesetters which expose web mounted recording materials as well as imagesetters which expose sheet materials. In addition to the inability to expose clamped material, unexposed regions of "direct-to-plate" materials also remain in the regions surrounding the RIP image. This problem has been solved in the past by the creation of a very large RIP image at the front end such that the RIP image is at least the same size as the plate to be produced. Here the RIP image includes the image to be printed plus a background region which is to be ink repellent at the press. This solution to the problem requires that the front end operator know the plate size prior to sending the image to the RIP. This solution is not always convenient since often times the front end images may be sent to a service bureau for off sight imagesetting and printing. In addition, if a large flat is to be assembled from more than one RIP image, then this too would have to be determined by the front end operator.

Having outlined the prior art methods of direct-to-plate exposure using a laser imagesetter and electronic prepress means and having detailed the steps of stripping multiple positive films into a flat and having described certain problems in the prior art, namely the need to remove or further process unexposed regions of a direct-to-plate material before mounting the plate onto the press, it is accordingly a general object of the present invention to provide a positive lithographic printing plate comprising at least one ink receiving RIP image region and at least one ink repellent background region which is not included in the RIP image.

It is a specific object of the present invention to provide an imagesetting exposure method which allows laser exposure of "direct-to-plate" materials in regions normally shielded by mechanical clamps and in regions not included in the RIP image.

It is a further object of the present invention to provide a laser imagesetter exposure method which allows exposure of a "direct-to-plate" recording substrate in all regions for which it is desired that the final plate be ink repellent thus eliminating the need for stripping, mechanical cutting, chemical removal, or additional exposure steps to remove unwanted ink receptive regions of the exposed "direct-to-plate material".

It is another object of the present invention that the parameters of the exposure mode of the present invention be under the control of the imagesetter operator requiring no interaction with the RIP or the front end and that the improved exposure method include only changes to the imagesetter.

SUMMARY OF THE INVENTION

The present invention provides a positive lithographic printing plate having at least one DTR processed ink receptive "RIP image" area and at least one DTR processed ink repellent background area which is not included in the RIP image. The present invention also provides an exposure method which comprises the steps of, pre-exposing a first mechanical gripper area, advancing the recording substrate web by a feed length which places the pre-exposed first mechanical gripper area into the mechanical clamp region, clamping the recording web, redefining the start and end of cross-scan travel of the imagesetter to new positions at least coincident with the edges of the recording web, exposing a first border area which extends from the first edge of the web to the first edge of the RIP image, exposing a negative of the positive RIP image, exposing a second border area which extends from the second edge of the RIP image to the second edge of the web, advancing the web by a feed length at least equal to the length of the exposed RIP image and exposing a second mechanical gripper area for the first RIP image and in the same step exposing a first mechanical gripper area for the next RIP image. The method has several modes of implementation which are dependent on operator selectable parameters.

BRIEF DESCRIPTION OF THE DRAWINGS

The objects and features set forth above and other objects and features of the invention will best be understood from a detailed description of a preferred embodiment thereof selected for the purposes of illustration and shown in the accompanying drawings wherein:

FIGS. 5 and 7 also include a graphical representation of a scan line signal generated by the imagesetter; and, FIGS. 8, 9 and 10 each depict a plurality of exposed positive lithographic printing plates as they would be imaged on an uncut web, illustrating the spacing between RIP images for the various imagesetter punch modes.

DETAILED DESCRIPTION OF THE INVENTION

Figure 1:
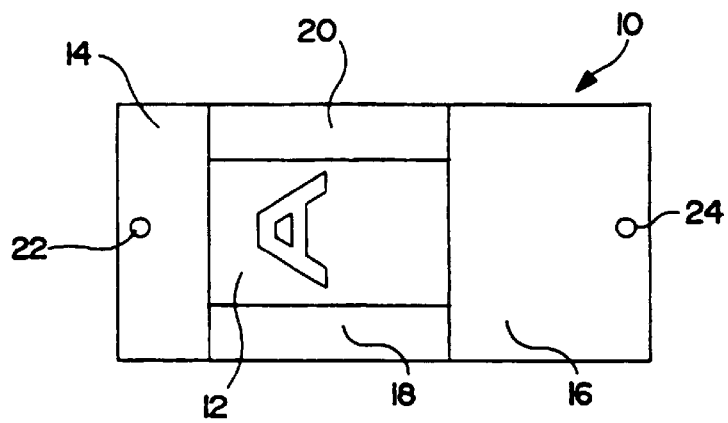
FIG. 1 depicts a positive lithographic printing plate, exposed by a laser imagesetter and chemically processed. The plate includes a DTR processed ink receptive negative RIP image and a DTR processed ink repellent background region as well as punched registration apertures.
Figure 2A:
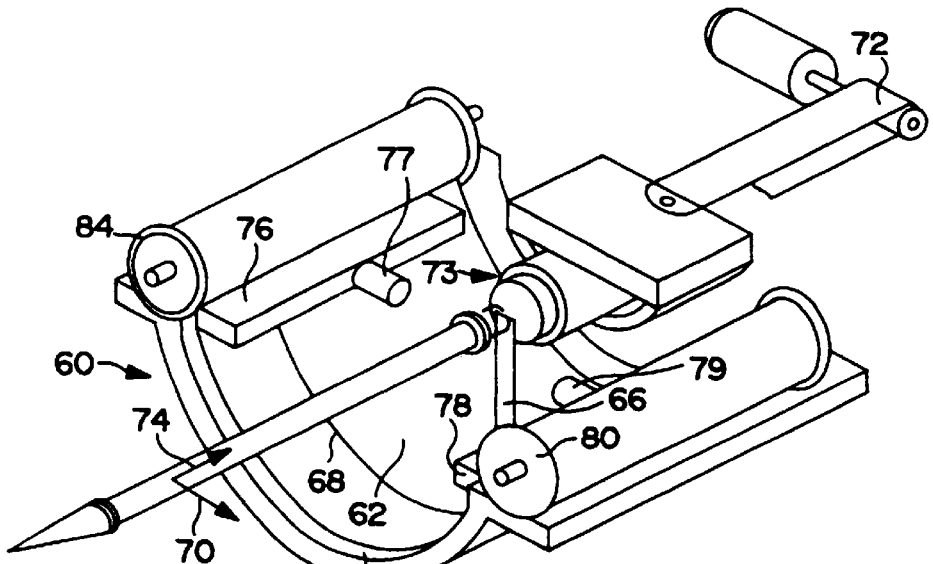
FIG. 2A is a perspective view in simplified form of an imagesetter.
Figure 2B:
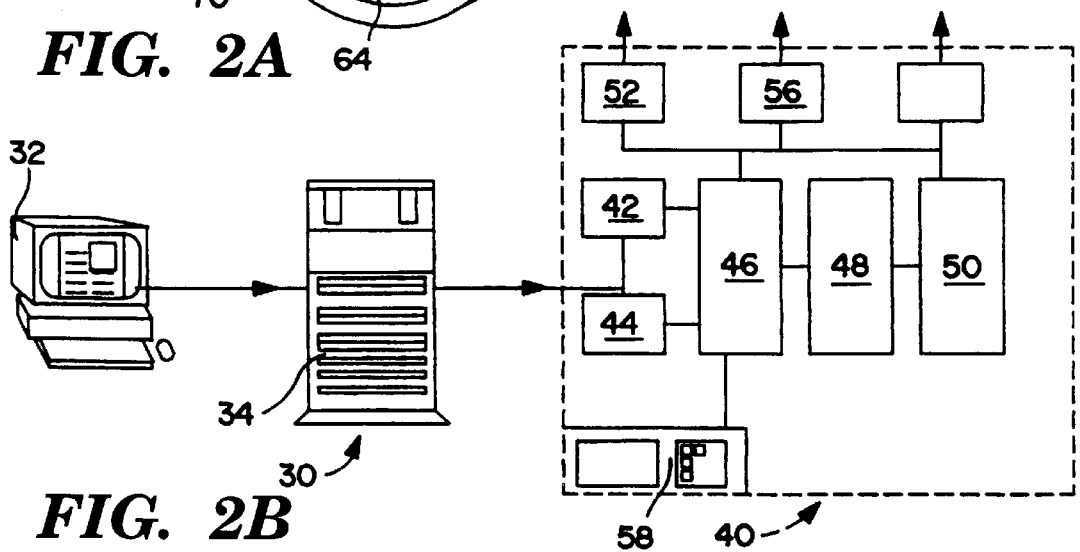
FIG. 2B is a schematic representation of an electronic prepress system depicting a front end or page layout workstation, a RIP, and an imagesetter electronic controller as well as key components of an internal drum laser imagesetter, shown isometrically.

Referring now to FIG. 1, a positive lithographic printing plate, generally indicated by reference numeral 10, is shown, as exposed by a laser imagesetter and after chemical processing. Plate 10 comprises an ink receptive, water repellent DTR-silver "RIP image" area 12, a first ink repellent water receptive DTR processed mechanical gripper area 14, a second ink repellent, water receptive DTR processed mechanical gripper area 16, a first ink repellent water receptive DTR processed border area 18, a second ink repellent water receptive DTR processed border area 20, a first registration pin aperture 22 and a second registration pin aperture 24;

FIG. 2B, is a schematic representation of an electronic prepress system, indicated generally by the reference numeral 30, comprising a front end or page layout workstation 32, a RIP 34, an imagesetter electronic controller assembly, generally referred to by reference numeral 40, as well as key components of an internal drum laser imagesetter, generally indicated by reference numeral 60, and depicted isometrically.

An image to be printed by offset printing means is assembled at front end 32, transmitted to RIP 34 for color separation, screening and rasterization and then transmitted to imagesetter 60 for recording on a laser sensitive DTR recording substrate in web form 62.

Figure 3:
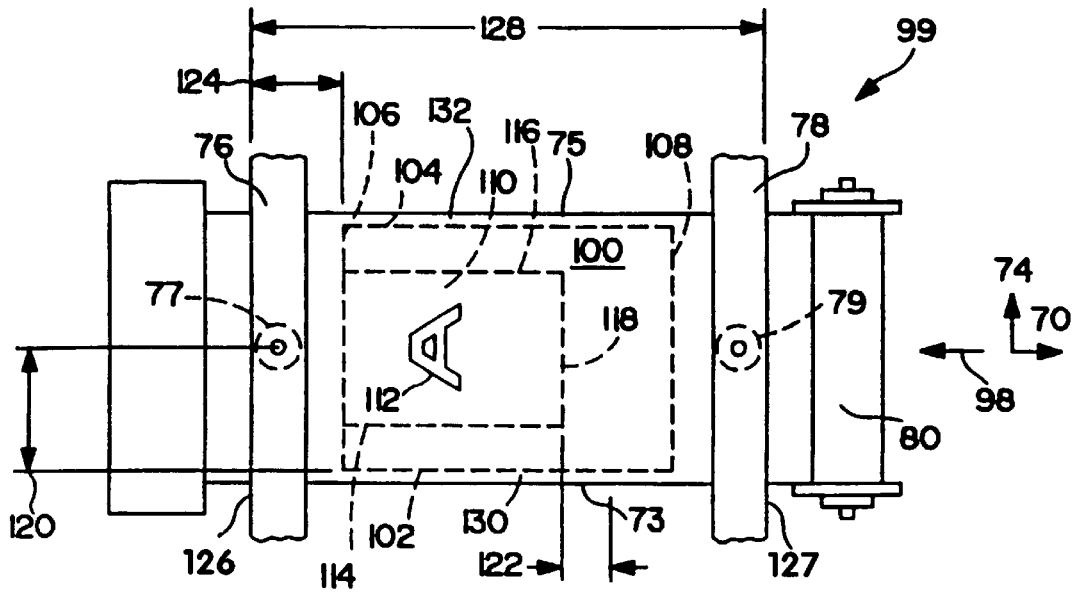
FIG. 3 depicts a plan view of the imagesetter web transport system as well as a prior art embodiment of the imagesetter exposure region. The web transport system is shown stretched into a single plane for illustrative purposes.

FIG. 3 depicts a plan view of the imagesetter web transport system, generally indicated by reference numeral 99, web 62 having been stretched into a single plane for illustrative purposes. Also shown in plan view are a particular prior art embodiment of an imagesetter exposure area, indicated by rectangle 100, as well as a sample of an exposed prior art positive RIP image indicated by rectangle 110. FIG. 3 will be used to describe prior art imagesetter exposure steps as well as the transport of web 62.

Figure 6:
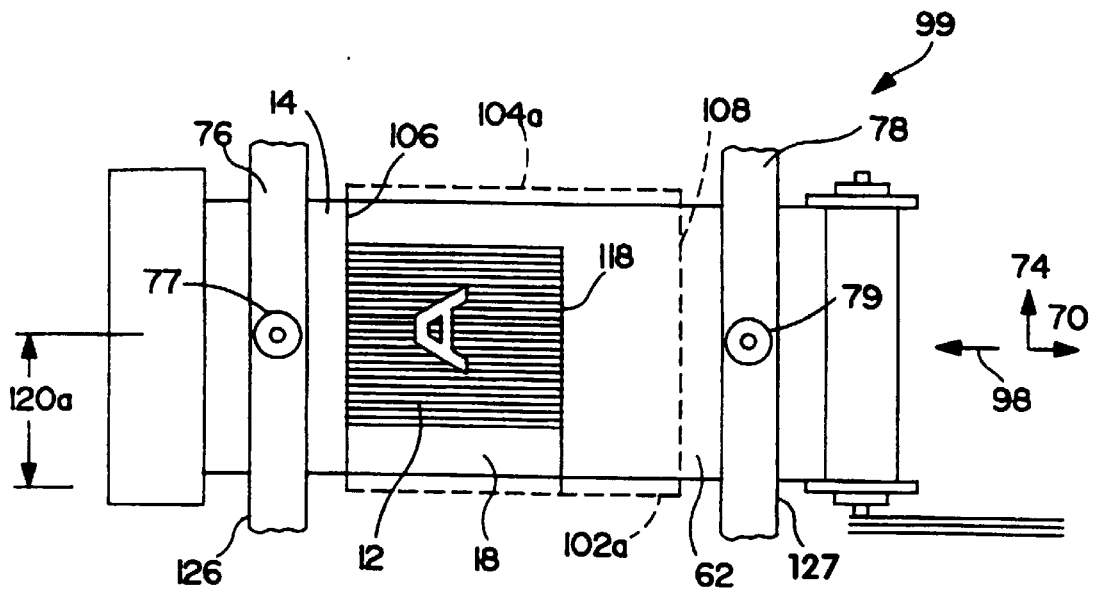
Figure 7:
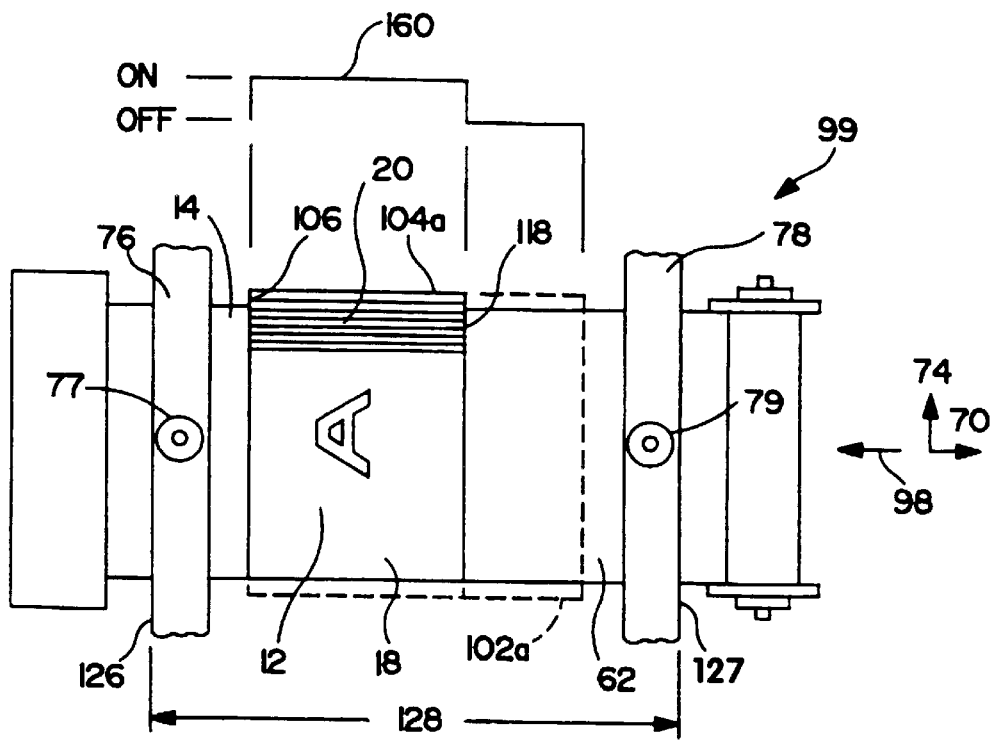
Figure 8:
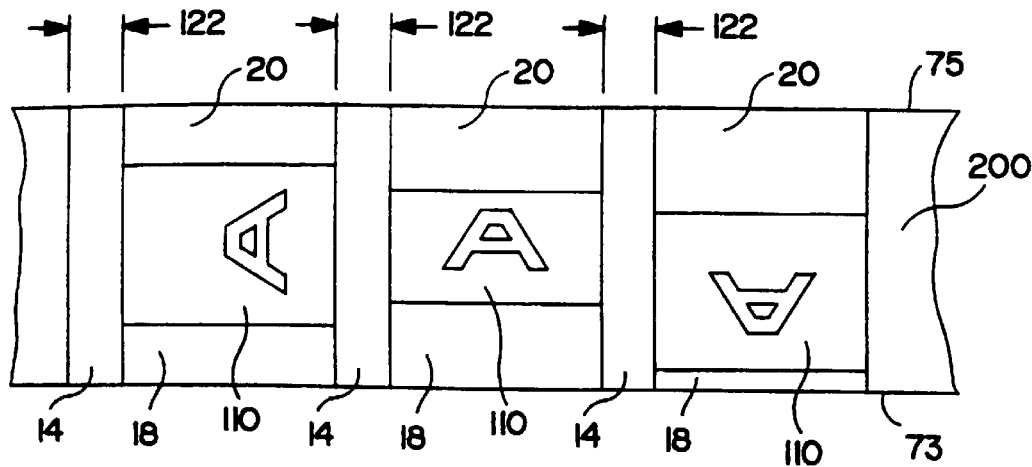
Figure 9:
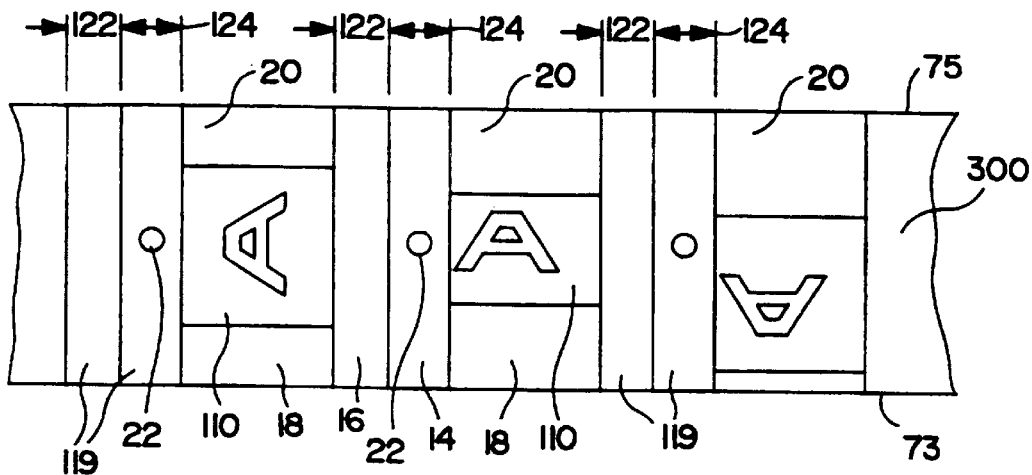
Figure 10:
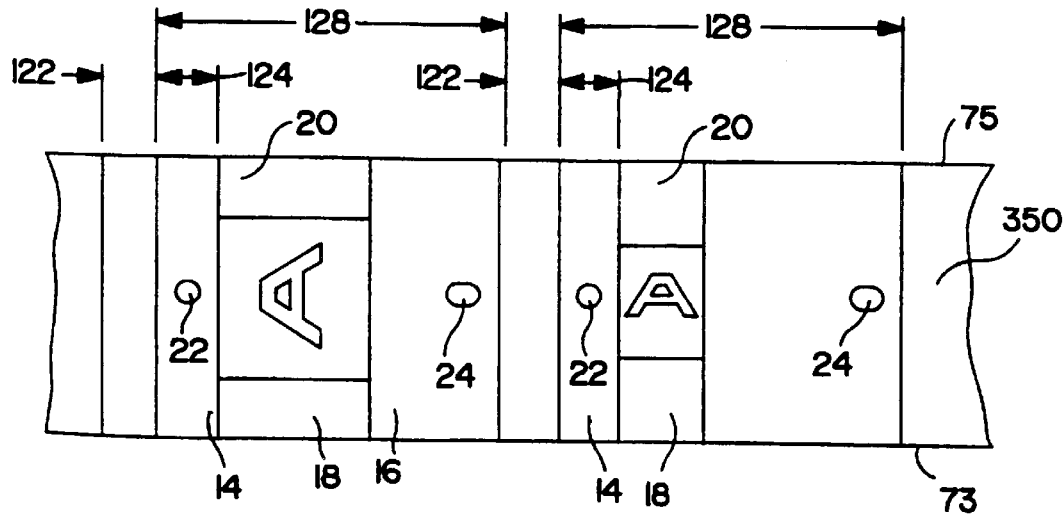

FIGS. 4 through 7 each depict a single exposure step of the improved method for laser exposure by an imagesetter and FIGS. 8 through 10 detail the spacing between images on the web 62 when the improved exposure method is used with various imagesetter operator selectable punch options.

Referring now FIGS. 2a and 2b, imagesetter electronic controller 40 includes serial communications interface module 42, which communicates with RIP 34 exchanging such information as "RIP image" size and resolution as well as status information for imagesetter 60 and RIP 34. Controller 40 also includes a parallel communications interface module 44 which is used to receive the RIP image data being transmitted from RIP 34. RIP image data received by parallel interface module 44 is loaded into image buffer 48 by main processor 46. Referring to FIG. 2A, the RIP image data is loaded as a series of scan lines 68 each scan line 68 comprising an equal number of image pixels, each image pixel providing a beam on, beam off command. The number of pixels which comprise a single scan line 68 is dependent on the dimension of the "RIP image" along scan direction 70, and the "RIP image" resolution. Both of these parameters are determined at front end 32.

Imagesetter 60 includes web mounted DTR recording substrate 62, a recording substrate support surface, or drum 64, and a focused scanning laser beam 66. Focused scanning laser beam 66 is scanned at constant scan velocity by a scanning mechanism, generally referred to by reference numeral 73, exposing scan line 68 which is parallel to scan direction 70. Beam modulation is controlled by beam modulation controller 52, modulating beam 66 in accordance with image pixel data stored in image buffer 48.

Imagesetter 60 also includes a cross-scan transport mechanism 72 which transports laser scanning mechanism 73, at constant cross-scan velocity, along a path parallel to cross-scan direction 74. Cross-scan velocity is selected to ensure that each scan line 68 partially overlaps the previous scan line. This requires that a new cross-scan velocity be selected for each exposure resolution. These cross-scan velocity values are stored in main processor 46.

Imagesetter 60 also includes header clamp mechanism 76, which clamps web 62, and at least one header punch mechanism 77 which punches first registration aperture 22 through web 62, (see FIG. 1). In addition, footer clamp mechanism 78 and at least one footer punch mechanism 79 provide the same clamp and punch functions, punching second registration aperture 24 through web 62. Punch mechanisms 77 and 79 provide a center reference for imagesetter 60 in that the center of each aperture punching mechanism is coincident with the center of travel for cross-scan transport mechanism 72.

Recording substrate, web 62 is supplied wound onto supply roller 80 which when mounted into the imagesetter will always be center justified according to the center of punches 77 and 79 and according to the center of travel of cross-scan transport mechanism 72. This allows a recording web 62 of any width to be centered with respect to the center of travel of cross-scan transport mechanism 72.

Web 62 passes from supply roll 80 between support drum 64 and footer clamp mechanism 78, remains in contact with drum 64, passes between support drum 64 and header clamp mechanism 76 and onto take-up roll 84. New unexposed recording material 62 always enters drum 64 from supply roll 80, advancing exposed recording material toward take-up roll 84. The transport direction of web 62 is indicated by arrow 98 shown in FIG. 3. The entire length of recording material web 62 is maintained light-tight to eliminate unwanted exposure of the recording substrate.

Output state machine 50 is designed for continuous steady state exposure of fast scan lines and coordinates synchronization of rotating laser scanner 73 with beam modulation controller 52 and cross-scan transport mechanism 72. Main processor 46 monitors the flow of data to and from image buffer 48 and starts and stops output state machine 50 if data for a full scan line is not available. This start and stop sequence is coordinated by main processor 46 and requires that cross-scan transport mechanism 72 stop, reverse direction, travel back beyond the last exposed scan line, stop, reverse direction again, ramp up to constant cross-scan exposure velocity and then expose a new scan line 68. Output state machine 50 re-initiates exposure of the next new scan line when cross-scan transport mechanism 72 reaches the appropriate cross-scan position. Once the entire RIP image has been exposed, main processor 46 sends an "end of job" message to the RIP 34 through serial communications module 42. Imagesetter 60 remains idle until RIP 34 initializes electronic controller 40 for a new take.

Imagesetter 60 is controlled by electronic controller 40 with main processor 46 coordinating all control systems. The imagesetter operator may input parameters through operator control panel 58, shown in FIG. 2b. These parameters are independent of and, in some cases, supersede parameters set by front end 32 or RIP 34. Operator selectable parameters, e.g. how many registration apertures to punch, image position, inter-image spacing and exposure mode, e.g. positive or negative, are all operator selectable. In addition, the imagesetter operator must input the width and type of recording material web 62.

In each case of an operator selectable parameter, main processor 46 invokes a series of command steps which coordinates the various control systems in performing image exposure and web transport steps. In addition to operator selectable parameters, main processor 46 also tracks preexisting conditions, e.g. is an exposed image residing in drum 64, or is this the first RIP image since a power up or installation of a new recording web 62. Depending on pre-existing conditions, main processor 46 invokes one of at least two modes of transporting web 62. A "start up" mode is selected after power up and a "continue" mode is invoked when a previously exposed RIP image resides in drum 64. The differences between these modes are subtle, however distinctions between "start up" and "continue" modes will be made in later sections.

The movement of recording web 62 is controlled by web transport controller 56 which initiates a series of commands to clamp and unclamp clamps 76 and 78, to punch registration apertures with punch mechanisms 77 and 79 and to advance web 62 by some "feed length". Upon receiving a "beginning of take" command from RIP 34, main processor 46 initiates a web feed which advances web 62. In "start up" mode, the feed length is long enough to clear drum 64 of recording material and re-filling it with unexposed web material. In "continue mode", when a previously exposed RIP image resides in drum 64, the feed length is equal to the dimension of the previous RIP image along scan direction 70 plus some additional feed length which is dependent on operator selectable parameters.

Turning now to FIGS. 2a, 2b and FIG. 3, imagesetter web transport system 99 and maximum exposure rectangle 100 are shown in plan view, web 62 having been stretched into a single plane for illustrative purposes. Rectangle 100 represents the boundaries of the maximum exposure zone for a particular prior art imagesetter embodiment and a particular recording material web width. The boundaries of rectangle 100 which shift with each web width include, start of cross-scan travel edge 102, end of cross-scan travel edge 104, start of scan line edge 106 and end of a scan line edge 108. Edge 102 represents the first exposable scan line 68 which can be scanned by scanning laser beam 66 when cross-scan transport mechanism 72 is at its home-position. Edge 102 also represents the maximum length of scan line 68, having its first pixel at beginning of scan edge 106 and its last pixel at end of scan edge 108.

An example of an exposed positive "RIP image" is also shown in FIG. 3, the RIP image comprising the exposed letter "A" 112 located within the dimensions of an unexposed rectangle 110. Rectangle 110 is the "RIP page size" and is specified at front end 32 however imagesetter 60 treats the exposed area 112 and unexposed region rectangle 110 as a single RIP image and it will be shown that changing the RIP page size at the front end can effect the spacing between consecutive RIP images. The boundaries of rectangle 110 include RIP image first scan line 114, RIP image last scan line 116, RIP image start of scan edge 106, and RIP image end of scan edge 118. Note that for this particular embodiment all scan lines 68 will have their first pixel placed coincident with start of scan edge 106. Also note that the boundaries of the RIP page size, rectangle 110 are shown for illustrative purposes and would not be exposed as part of the RIP image.

The positive RIP image example given in FIG. 3 represents the use of the imagesetter in the prior art whereby a DTR photographic recording substrate is exposed with a positive image and in subsequent steps a plate image is exposed by contact printing means. Note also that the exposed RIP image depicted would not actually be visible until after chemical processing of the substrate.

The position of RIP image 110 is operator selectable along cross-scan direction 74 and can be center justified as shown in FIG. 3 or edge justified, with first RIP image scan line 114 being placed coincident with start of cross-scan travel edge 102. For each new recording material web width, main processor 46 resets the position of start of cross-scan-edge 102 by adjusting dimension 120 in accordance with the web width entered at operator control panel 58. This step sets the home-position of cross-scan transport mechanism 72 and always places start of cross-scan edge 102 some fixed distance from web edge 73 and places end of cross-scan edge 104 some fixed distance from web edge 75. In the prior art embodiment, border regions 130 and 132 could not be exposed by the laser.

At least three imagesetter operator selectable punch options are provided in the present invention which include no punching, header punch 77 active only or both header and footer punches 77 and 79 active. With each punch option, a new web feed length sequence is initiated by main processor 46. In addition to selecting various punch parameters, an imagesetter operator can specify an inter-image spacing, dimension 122 which provides an additional feed length between consecutive RIP images. In prior art imagesetters, the inter-image spacing, dimension 122 would not have been exposed, but is exposed in the present invention. Dimension 122 can be set at zero.

When no punches are active and dimension 122 is zero, the feed length of web 62 is equal to the dimension of the previous RIP image along scan direction 70, e.g. scan line 114 or 116. Web 62 is always transported in direction 98 indicated in FIG. 3. Using the RIP image of FIG. 3 as an example a web feed command would advance RIP image end of scan edge 118 to a position coincident with start of scan edge 106. For a non-zero inter-image spacing, web 62 would be advanced by an additional feed length equal to dimension 122.

For the case of header punch 77 only active, the feed length of web 62 is equal to the sum of the length of the previous RIP image along scan direction 70 plus dimension 122, plus dimension 124. Dimension 124 is an additional feed length selected to ensure that end of scan edge 118, of the previous RIP image, advances at least to edge 126 of web clamp 76. This prevents clamp 76 or punch 77 from damaging the previous RIP image. Using the RIP image of FIG. 3 as an example, with zero inter-image spacing 122, edge 118 would advance to a position coincident with edge 126 of header clamp 76. For non-zero inter-image spacing the web 62 would advance an additional amount equal to dimension 122.

Finally for the case where both header and footer punches 77 and 79 are active, the feed length of web 62 is equal to the sum of the length of dimension 128 plus dimension 122. Dimension 128 is selected to ensure that the footer registration aperture 24 advances beyond edge 126 of web clamp 76. In this case dimension 122 is not measured from RIP image end of scan edge 118 but would increase the spacing between footer registration aperture 24 of the previous RIP image and header registration aperture 22 of the next RIP image.

Having presented a particular prior art embodiment in FIG. 3 it should be noted that in this embodiment the region between header clamp edge 126 and start of scan edge 106 can not be exposed. In addition, when both punch mechanisms 77 and 79 are active, the region between RIP image end of scan edge 118 and web clamp edge 127 can not be exposed. Also the two border areas 130 and 132 can not be exposed in this embodiment. In order to provide an exposure method for "direct to plate" materials, these regions and others must be exposed and a negative of the positive RIP image shown in FIG. 3 must be exposed. An improved exposure method is detailed below.

The details of the exposure method are described below and depicted in FIGS. 4 through 7. An exposed and chemically processed printing plate produced by the exposure method described by the present invention is detailed in FIG. 1. The use of the exposure method for the exposure of a continuous series of printing plates on a web is detailed in FIGS. 8 through 10.

The exposure method as implemented in the imagesetter start up mode is illustrated in FIGS. 4a, 5, 6, and 7 and comprises the steps of, pre-exposing first mechanical gripper area 14, advancing web 62 by a distance at least equal to dimension 124, punching registration apertures 22 and 24, redefining the start and end of cross-scan travel edge 102 and 104 to the new positions 102a and 104a, at least coincident with edges 73 and 75 of web 62, exposing first border area 18, exposing a negative of the positive image being sent by RIP 34 and exposing second border area 20. The exposure of a second mechanical gripper area 16 occurs upon initiation of the next, yet unexposed RIP image. The exposure method of the present invention has several modes of implementation each of which is dependent upon the particular operator selectable parameters and upon whether a "start" or "continue" situation exists.

The initial conditions for the exposure method require that the imagesetter operator install a recording web 62 which contains a "direct to plate" DTR recording substrate, enter the web width dimension at operator control panel 58, set the imagesetter for PLATE operation invoking the exposure method of the present invention and select the "reverse video" mode which invokes a series of commands to reverse all RIP image data from either positive to negative or negative to positive. The reverse video mode is not part of the present invention but is well known in the art.

A series of initializing messages between RIP 34 and imagesetter 60 communicates that a RIP image is being sent. These messages are the same for all imagesetter modes and include a "set parameters" and "begin take" command sent from RIP 34 to imagesetter 60 via serial interface module 42. The "set parameters" command provides the resolution and dimension along scan direction 70 of the RIP image. Main processor 46 sets the length of each RIP image scan line 68 equal to the length of the RIP image along direction 70 and sets imagesetter 60 to exposure at the resolution of the RIP image being sent. RIP 34 then sends a "begin take" command to imagesetter 60 which initiates the "direct-to-plate" exposure method detailed below.

Figure 4A:
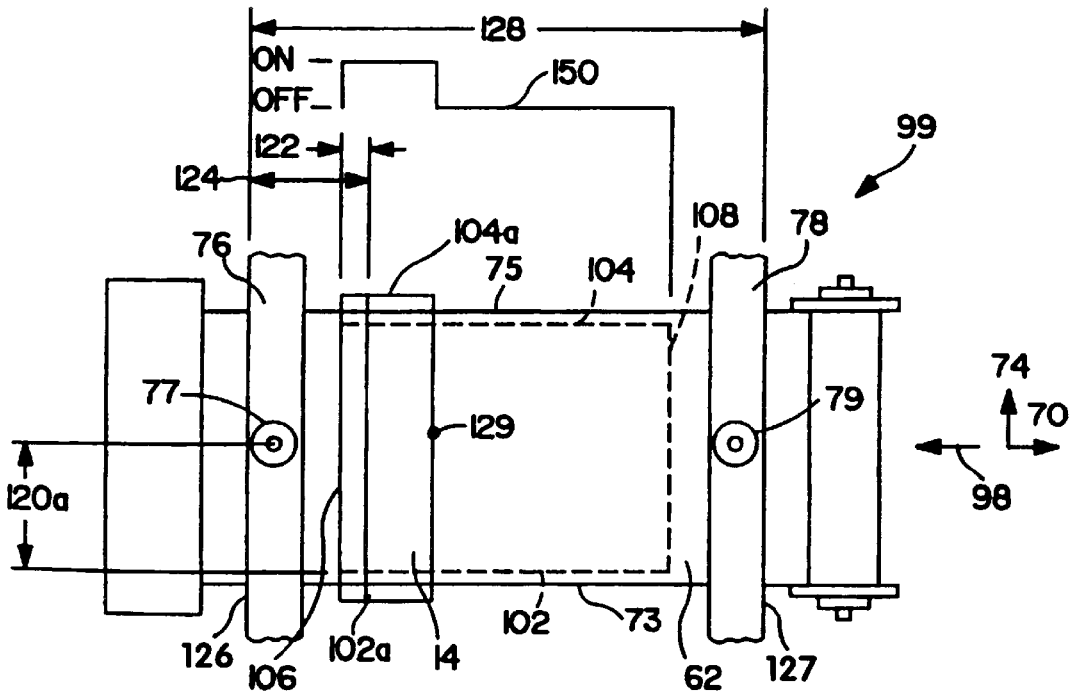
FIG. 4a depicts the web transport system and exposure region of an improved imagesetter illustrating the new step of exposing a first mechanical gripper area when the imagesetter is in a power up mode and also depicting a graphical representation of a scan line signal generated by the imagesetter.
Figure 4B:
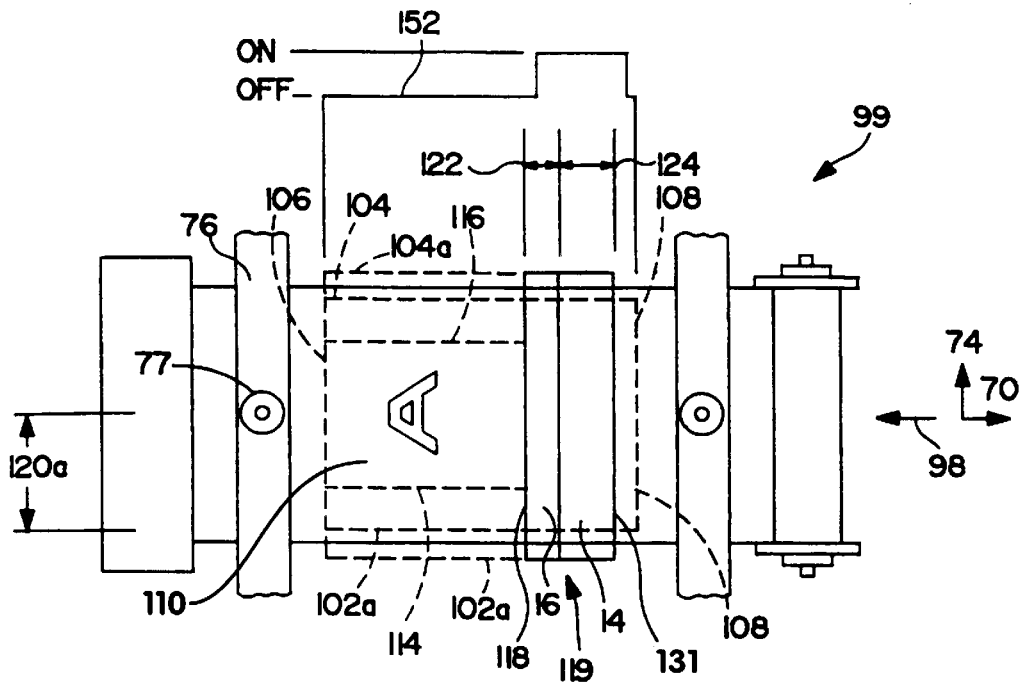
FIG. 4b depicts the web transport system and exposure region of an improved imagesetter illustrating the new step of exposing a first mechanical gripper area when a previously exposed RIP image is still present and also depicting a graphical representation of a scan line signal generated by the imagesetter.

Referring now to both FIGS. 4a and 4b, the exposure of mechanical gripper area 14 includes a first step of, determining the imagesetter mode, "start up" or "continue" determining the inter-image spacing set by the imagesetter operator, dimension 122, and determining the punch option selected. Depending on these parameters, imagesetter 60 establishes the location and dimension along scan direction 70 of gripper area 14.

FIG. 4a depicts gripper area 14 as it would be exposed when imagesetter 60 is in the "start up" mode with either no punch selected or header punch 77 only, active. FIG. 4a also applies when imagesetter 60 is in the "continue" mode and both punches 77 and 79 are selected. Under these conditions the start of scan of gripper area 14 is always coincident with start of scan edge 106 and gripper area 14 will have a length along scan direction 70 equal to dimension 122 in the no punch mode or equal to the sum of dimension 122 plus dimension 124 when punch 77 only or when punch 77 and 79 are active.

FIG. 4b depicts a combined gripper area, generally referred to by reference numeral 119 which comprises second gripper area 16 for the exposed RIP image, rectangle 110 and first gripper area 14 for the next, yet unexposed RIP image. A combined gripper area 119 is exposed when imagesetter 60 is in the "continue" mode with either no punches selected or header punch 77 only, selected. In this mode, the start of scan edge of combined gripper area 119 is located coincident with the exposed RIP image end of scan edge 118. When no punches are selected, combined gripper area 119 will have a dimension along scan direction 70 equal to dimension 122, which can be zero. With only header punch 77 active, combined gripper area 119 will have a dimension along direction 70 equal to the sum of dimension 122 plus dimension 124. The logical steps which determine the placement and size of combined gripper area 119 are performed by main processor 46.

If the dimension along scan direction 70 of combined gripper area 119 is longer than the dimension from RIP image end of scan edge 118 to imagesetter end of scan edge 108, a web feed is invoked and web 62 is advanced by a feed length sufficiently long to advance enough unexposed web material into image rectangle 100 to expose combined gripper area 119.

Once the start of scan position and dimension along scan direction 70 of gripper area 14 or combined gripper area 119 have been established, main processor 46 redefines start of cross-scan travel edge 102 to a position 102a which is at least coincident with edge 73 of web 62, and then redefines end of cross-scan travel edge 104 to a position 104a which is at least coincident with edge 75 of web 62. This ensures that web 62 can be edge to edge exposed from edge 73 to edge 75.

Main processor 46 then composes a scan line signal shown graphically in FIGS. 4a and 4b as scan line signal 150 and 152 respectively. This scan line signal, 150 or 152, composed by main processor 46, is loaded into image buffer 48 and is used to expose web 62 in the spatial regions indicated by gripper area 14 or combined gripper area 119. Scan line signals 150 and 152 cause imagesetter 60 to expose web 62 in regions labeled "on" and to not expose web 62 in regions labeled off. Note that scan line signal 152 is unique for each new RIP image.

Having determined the location and dimension along scan direction 70 of gripper area 14, shown in FIG. 4a, or combined gripper area 119, shown in FIG. 4b, main processor 46 calculates the total number of scan lines required to edge to edge expose a gripper area from edge 102a to edge 104a. In all cases, the total number of scan lines is dependent on the resolution of the next, yet unexposed RIP image and the exposure resolution of a gripper area will always match the resolution of the unexposed RIP image. This occurs since the steps which initiate the exposure of a gripper area 14 or 119 follow the set parameters command which sets imagesetter exposure resolution equal to that of the unexposed RIP image.

With the number of scan lines in the gripper area 14 or 119 determined, main processor 46 initializes output state machine 50 to expose the entire gripper area. Upon completion of this exposure step, imagesetter 60 waits for an "end of take" message from RIP 34. The "end of take" message includes the size of the unexposed RIP image along direction 74. Main processor 46 then calculates the total number of scan lines in the unexposed RIP image and sets the position of the RIP image start and end of cross-scan edges 114 and 116. The location along cross-scan axis 74 of the RIP image is an imagesetter operator selectable parameter.

Having exposed gripper area 14 or 119 and having received all the dimensions of the unexposed RIP image, main processor 46 initiates a web feed, advancing gripper area 14 or 119 into the region of web clamp 76. Referring to FIG. 4a and the "start up" mode, web 62 is advanced to a position which places end of gripper area 14, edge 129 coincident with start of scan edge 106. Here web 62 is advanced a distance equal to dimension 122 when no punches are active or, equal to the sum of dimension 124 plus dimension 122 when punch 77 only is active.

Referring to FIG. 4b and the "continue" mode, main processor 46 invokes a web feed which places end of combined gripper area 119, edge 131 coincident with start of scan edge 106. In this case, web 62 is advanced a distance equal to the length of the previous RIP image along scan direction 70 plus dimension 122 when no punches are active, plus dimension 124 when header punch 77 only is active. Once the advancement of web 62 is complete, main processor 46 activates both clamp mechanisms 76 and 78 and actives punch mechanism 77, if selected.

Figure 5:
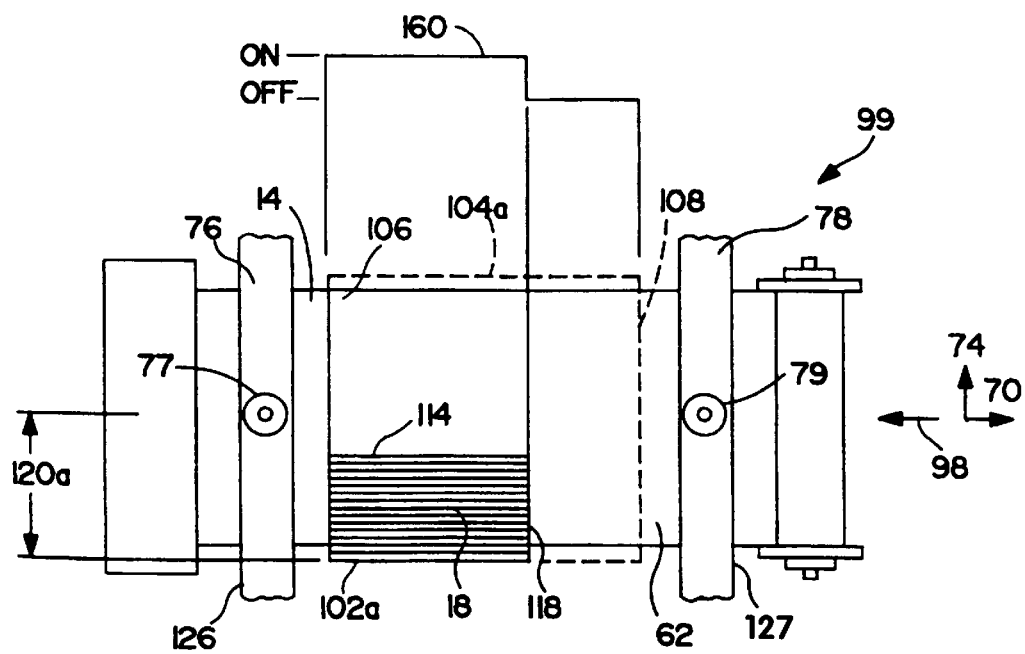
FIGS. 5, 6 and 7 depict in sequence the web transport and exposure region of the improved imagesetter detailing the exposure of a first and second border area as well as the exposure of a negative of the positive RIP image.

The steps of exposing first border area 18, exposing a negative of the RIP image being sent by RIP 34 and exposing second border area 20 are depicted in FIGS. 5, 6 and 7 and employ a series of steps which are identical for the "start up" and "continue" modes of imagesetter 60 as well as for all operator selectable modes such as punch configuration or inter-image spacing. One exception is in the imagesetter operator selectable parameter of RIP image position along cross-scan axis 74 which will position the RIP image differently but will not affect the following steps.

The exposure of border area 18 includes a first step of moving cross-scan transport mechanism 72 to its new home-position as defined in an earlier step. This places scanning laser beam 66 coincident with start of cross-scan edge 102a. Main processor 46 then composes scan line signal 160, shown in FIG. 5, which provides the commands to expose border area 18, area 18 extending along scan direction 70 from start of scan edge 106 to end of scan edge 118 of the next yet unexposed RIP image. Main processor 46 then calculates the number of scan lines required to expose border area 18 at the resolution of the unexposed RIP image. The dimension of border area 18 along direction 74 will vary depending on the size of the RIP image along direction 74 and the RIP image justification set by the imagesetter operator. In all cases, main processor 46 determines the number of scan lines required to expose border area 18 which extends along cross-scan direction 74 from start of cross-scan edge 102a to start of cross-scan edge 114 of the unexposed RIP image. Main processor 46 then initializes output state machine 50 which coordinates the exposure of border area 18.

During the exposure of border area 18, main processor 46 begins loading RIP image data into image buffer 48. Upon completion of exposure of border area 18, main processor 46 feeds RIP image scan data to output state machine 50 which reverses the polarity of each pixel exposing a negative of the positive RIP image. The transfer of RIP image data from RIP 34 to parallel interface module 44 to main processor 46 and to image buffer 48 continues until the entire RIP image is exposed.

To expose border area 20, main processor 46 stops cross-scan transport 72, backs up transport 72 and restarts it as was described early. Main processor 48 rebuilds scan line signal 160 and calculates the number of scan lines required to expose border area 20. Border area 20 extends along direction 74 from end of RIP image cross-scan edge 116 to end of cross-scan edge 104a. Border area 20 has a dimension along direction 70 which is equal to the RIP image dimension extending from start of scan edge 106 to RIP image end of scan edge 118.

The present invention as described above allows the creation of a continuously exposed web. Such a web is depicted in FIG. 8 which illustrates a continuous web 200 produced in the particular mode when no punches are selected. Web 200 comprises multiple negatively exposed and DTR processed ink receptive RIP images, each RIP image being separated by a DTR processed ink repellent edge to edge inter-image region of dimension 122, which is selected by the imagesetter operator. From web 200, the imagesetter operator may select an individual plate which may include a single RIP image with ink repellent mechanical gripper area 14, of dimensions equal to ½ of dimension 122. Each plate would also include an ink repellent first and second mechanical border areas 18 and 20. The imagesetter operator may also select an individual plate comprising more than one negatively exposed RIP images, each RIP image being separated by a DTR processed ink repellent edge to edge inter-image region of dimension 122. Furthermore, the imagesetter operator can vary the inter-image spacing between RIP images from one RIP image to the next by loading new inter-image spacing values for each RIP image. By inputting various inter-image spacing values, an imagesetter operator can create a custom printing plate which has the particular characteristic that it has an edge to edge DTR processed ink repellent first mechanical gripper area 14, more than one abutting or separated negatively exposed DTR processed RIP images, the separation between RIP images being edge to edge DTR processed ink repellent regions of a selectable length, the custom printing plate further comprising more than one DTR processed ink repellent border area 18, each area 18 extending from web edge 73 to the edge of the RIP image, and more than one DTR processed ink repellent border areas 20, each area 20 extending from the second edge of the RIP image to web edge 75.

FIG. 9 depicts web 300 created by the present invention when punch mechanism 77 only is active. Web 300 includes multiple individual printing plates, each plate comprising a negatively exposed RIP image, an edge to edge DTR processed ink repellent first mechanical gripper area 14, which includes a registration aperture 22, a second edge to edge DTR processed ink repellent mechanical gripper area 16 which has dimension 122 and first and second DTR processed ink repellent border area 18 and 20. Note that a combined gripper area 119 includes gripper area 16 for one RIP image and gripper area 14 for the next RIP image. In this mode, the imagesetter operator can also vary inter-image spacing as well as select and de-select punch mechanism 77 to create a custom plate which includes one or more RIP images separated by edge to edge ink repellent regions with only a single registration aperture 22.

The exposure method used when both punch mechanisms 77 and 79 are active is detailed below. Referring to FIG. 4a, first mechanical gripper area 14 is exposed by the detailed steps presented above and web 62 is then advanced by a distance equal to dimension 124 or dimension 122 plus dimension 124 if inter-image spacing in non-zero. This places edge 129 coincident with start of scan edge 106. Both punches are then activated punching registration aperture 22 and 24. The steps of exposing border area 18 and 20 as well as a negative of the RIP image are unchanged from those described above and are shown in FIGS. 5 through 7.

Referring now to FIG. 7, web 62 is advanced such that end of RIP image edge 118 is coincident with start of scan edge 106. Main processor 46 then creates a scan line signal which will expose a second mechanical gripper area 16. The dimension of gripper area 16 along scan direction 70 is equal to dimension 128 less dimension 124 less the dimension of the exposed RIP image along scan direction 70. Having exposed second gripper area 16, web 62 is advanced by a distance equal to the dimension of the just exposed gripper area 16 along scan direction 70.

Web 350, created when both punches 77 and 79 are active, is shown in FIG. 10. In this case a series of plates are created with edge to edge DTR processed ink repellent first and second mechanical gripper areas 14 and 16, two registration apertures 22 and 24 two DRT processed ink repellent border areas 18 and 20 and with the characteristic that each plate has a length equal to dimension 128 or dimension 128 plus dimension 122.

A further variation on this mode is that the imagesetter operator can enter the desired plate length. In this mode, no punches, or punch mechanism 77 only, can be active and the overall plate length is entered at operator control panel 58. Referring again to FIG. 7, after exposing first mechanical gripper area 14, border areas 18 and 20 as well as a negative of the RIP image, web 62 is advanced such that the end of RIP image scan edge 118 is placed coincident with start of scan edge 106. Main processor 46 then creates a scan line signal which allows the distance between the end of the RIP image edge 118 and the end of the plate, of length specified by the operator, to be exposed. The dimension of second mechanical gripper area 16 created in this mode is given by the overall plate dimension entered, less dimension 124, less dimension 122, less the dimension of the exposed RIP image along scan direction 70. After exposure of gripper area 16, web 62 is again advanced by a distance equal to the dimension of the just exposed second mechanical gripper area 16. This mode creates a series of plates each plate having the same overall length regardless of RIP image size or the inter-image spacing specified.

What we claim and desire to secure by Letters of Patent of the United States are the following:

1. An electronic prepress system for producing lithographic printing plates, comprising:

a. means for storing, electronically assembling and editing digital images to be printed;

b. raster image processor means for processing said digital images thereby producing a rasterized RIP image; and, c. means for exposing a reverse video image of said rasterized RIP image directly onto a lithographic printing plate, including support means for supporting said lithographic printing plate, scanning means for scanning a focused laser beam onto said lithographic printing plate, controlling means for controlling said scanning mechanism to expose said rasterized RIP image onto an image area of said lithographic printing plate and wherein said scanning mechanism is further controlled by the controlling means to expose a background area of said lithographic printing plate, said background area including the entire area of said lithographic printing plate which is not included in said rasterized RIP image.

2. The system for producing lithographic printing plates according to claim 1 further comprising transport means for transporting the lithographic printing plate across said support means and clamping means for clamping said lithographic printing plate to said support means, and wherein said background area includes portions of lithographic printing plate which are clamped by said clamping means during exposure of said image area.

3. The system for producing lithographic printing plates according to claim 1 wherein said controlling means is capable of controlling said transport means and said scanning means to produce consecutive lithographic printing plates of equal size independent from the size of said rasterized RIP image.

4. An apparatus for exposing rasterized RIP images directly onto lithographic recording material to produce lithographic printing plates, comprising support means for supporting said lithographic recording material, scanning means for scanning a focused laser beam onto said recording material, controlling means for controlling said scanning mechanism to expose said rasterized images onto an image area of said recording material and to expose a background area of said recording material wherein said background area includes the entire area of said lithographic printing plate which is not included in said rasterized RIP images.

5. The apparatus according to claim 4 further comprising transport means for transporting the lithographic recording material across said support means and clamping means for clamping said recording material to said support means, and wherein said background area includes portions of recording material which are clamped by said clamping means during exposure of said image area.

6. An apparatus for exposing rasterized images directly onto a lithographic recording material to produce lithographic printing plates, comprising support means for supporting said lithographic recording material, scanning means for scanning a focused laser beam onto said recording material, transport means for transporting said recording material across said support means, controlling means for controlling said scanning mechanism and said transport means to expose any area on the lithographic recording material.

7. The apparatus according to claim 6 wherein said controlling means is capable of controlling said scanning mechanism and said transport means to produce consecutive lithographic printing plates of equal size, independent from the size of said rasterized images.

8. An electronic prepress system for preparing a lithographic printing plate, comprising:
   a. a workstation for storing, electronically assembling and editing digital images to be recorded onto the lithographic printing plate;
   b. a raster image processor, in communication with the workstation, for receiving the digital images from the workstation and for producing at least one rasterized RIP image for recording onto the lithographic printing plate; and,
   c. a recording device, in communication with the raster image processor, for receiving the rasterized RIP image from the raster image processor and for exposing a reverse video image of said at least one rasterized RIP image directly onto the lithographic printing plate and for exposing a background area of the lithographic printing plate wherein the background area includes the entire area of the lithographic printing plate which is not included in said at least one rasterized RIP image.

9. An electronic prepress system according to claim 8 wherein said raster image processor produces a plurality of rasterized RIP images and wherein said recording device exposes a reverse video image of each of said rasterized RIP images onto the lithographic printing plate and wherein said background region includes the entire region of the lithographic printing plate which is not included in said plurality of rasterized RIP images.

* * * * *